(12) United States Patent
Holder et al.

(10) Patent No.: US 7,748,872 B2
(45) Date of Patent: Jul. 6, 2010

(54) LIGHT-CONDUCTING PEDESTAL CONFIGURATION FOR AN LED APPARATUS WHICH COLLECTS ALMOST ALL AND DISTRIBUTES SUBSTANTIALLY ALL OF THE LIGHT FROM THE LED

(75) Inventors: Ronald G. Holder, Laguna Niguel, CA (US); Greg Rhoads, Irvine, CA (US)

(73) Assignee: Cooper Technologies Company, Houston, TX (US)

( * ) Notice: Subject to any disclaimer, the term of this patent is extended or adjusted under 35 U.S.C. 154(b) by 240 days.

(21) Appl. No.: 11/995,597

(22) PCT Filed: Jul. 12, 2006

(86) PCT No.: PCT/US2006/026997

§ 371 (c)(1),
(2), (4) Date: Jan. 14, 2008

(87) PCT Pub. No.: WO2007/018927

PCT Pub. Date: Feb. 15, 2007

(65) Prior Publication Data

US 2008/0225528 A1  Sep. 18, 2008

Related U.S. Application Data

(60) Provisional application No. 60/701,900, filed on Jul. 22, 2005.

(51) Int. Cl.
*F21V 7/00* (2006.01)
*F21V 5/00* (2006.01)

(52) U.S. Cl. ............... 362/308; 362/309; 362/327; 362/328

(58) Field of Classification Search ......... 362/307–309, 362/327–329, 331, 332, 335; 257/98, E33.073
See application file for complete search history.

(56) References Cited

U.S. PATENT DOCUMENTS

| | | | |
|---|---|---|---|
| 6,547,423 B2 | 4/2003 | Marshall et al. | |
| 7,111,964 B2 * | 9/2006 | Suehiro et al. | 362/328 |
| 7,126,273 B2 | 10/2006 | Sorg | |
| 7,175,299 B2 * | 2/2007 | Uke et al. | 362/187 |
| 2002/0163808 A1 | 11/2002 | West et al. | |

OTHER PUBLICATIONS

International Searching Authority, The International Search Report and The Written Opinion for PCT/US06/26997 dated Jul. 12, 2007, 7 pages.

* cited by examiner

*Primary Examiner*—Bao Q Truong
(74) *Attorney, Agent, or Firm*—Daniel L. Dawes; Marcus C. Dawes

(57) ABSTRACT

An apparatus comprises a light source, preferably an LED, a reflector, a light-conducting element mounted on the light source for directing light from the light source to an end of the light-conducting element, and a lens mounted on the end of the light-conducting element for directing light into a central beam. Light from the light source is directed to the reflector into a peripheral beam. The central and peripheral beams comprise substantially all of the light generated by the light source. The lens is in effect mounted on a pedestal above the LED. The pedestal transmits all the light rays in the central solid angle to the lens without loss.

16 Claims, 4 Drawing Sheets

LIGHT-CONDUCTING PEDESTAL CONFIGURATION FOR AN LED APPARATUS WHICH COLLECTS ALMOST ALL AND DISTRIBUTES SUBSTANTIALLY ALL OF THE LIGHT FROM THE LED

RELATED APPLICATIONS

The present application is related to U.S. Provisional Patent Application Ser. No. 60/701,900, filed Jul. 22, 2005, pursuant to 35 USC 119 and is incorporated herein by reference.

BACKGROUND OF THE INVENTION

1. Field of the Invention

The invention relates to the field of apparatus and method utilizing light emitting diodes (LED) in an improved apparatus and method of collecting the energy radiating from them.

2. Description of the Prior Art

In the prior art either a lens or a reflector are used to collect the substantially 180 degree hemispherical light radiating from the LED. Total internal reflection (TIR) is also used where the energy from the LED is collected both by an internal shaped reflector-like surface of the lens and a lens formed on either the outside or inside surface of the lens as shown in Marshall U.S. Pat. No. 6,547,423.

Devices using a reflector alone generate two beams, one beam is reflected and controlled by the reflector and one beam is direct radiation from the LED and is not controlled. This direct light may appear as a large halo around the reflected beam. In the typical LED 'package' with a ball lens situated in front of a cylindrical rod, the side emitted energy from the LED is substantially uncontrolled. In TIR systems, some portion of the energy radiating from the LED is leaked through the walls of the package and remains uncontrolled. Additionally, there are bulk and form losses. In systems with LEDs reversed and pointed into a concave reflector, the center energy from the LED is shadowed by the LED package itself, so this energy is typically lost or not collected into a desired beam.

What is needed is some type of apparatus and method of illumination wherein each of the defects of the prior art are overcome.

BRIEF SUMMARY OF THE INVENTION

The invention is an apparatus and method to provide almost complete collection efficiency of the energy radiating from an LED, and then distributes this energy into a controlled and definable beam pattern. To a substantial degree the only energy loss is due to the inherent imperfection of the optical elements as reflectors and refractors and energy absorption in the optical medium forming any lenses, reflectors or other optical elements and figure losses which are due to microscopic imperfections in the geometry of the optical elements. The number of touches or the number of reflections/refractions which give rise to these inherent losses is also minimized.

The invention collects substantially all the light, or energy, radiating from an LED source and redirects it into two distinct beams of light. By design, these beams could be aimed primarily into a single direction, but need not be. There are several substantial improvements in the invention over the prior art.

The invention collects all the LED energy in two controlled beams. The first beam is generated from the forward approximately 45 degree half angle centered on the optical axis of the light fixture or optical system, and the second beam is generated from the LED energy that is between the approximately 45 degree half angle and approximately 95 degree half angle of the optical axis. Typically, the optical system is symmetric about an axis of rotation, thereby defining an optical axis, although this need not be a necessary limitation of the invention, which includes within its scope asymmetric symmetries or for that matter optical systems which have an entirely arbitrary form. The invention thus controls substantially all of the energy radiating from the LED with only surface and small figure loss.

The energy in the first beam is collected via a lens that is forward of the LED. The energy in the second beam is collected via a reflector. The resultant combined beam can be designed to match system requirements by altering either or both of the primary elements, namely the lens or the reflector. The lens in the illustrated embodiment is roughly hemispherical, but may have any desired shape or form. It is within the scope of the invention that the surface of the lens could also be modified to control the resultant beam, i.e. provided with a surface treatment, modification or coating to provide a desired optical effect such as a frosted, faceted or dimpled surface. The reflector may be designed to provide a collimated beam, a convergent beam or a divergent beam. The reflector may be a common conic section or not and may be faceted or dimpled or otherwise modified to provide a desired beam pattern. The optical system or device may optionally have at least one additional lens or surface(s) that further control(s) or modifies the light radiating from the primary reflector and lens, such as stacked lenses or surface modifications of one or more lenses. Therefore, lens assemblies are contemplated as lying within the scope of the invention.

The lens is presented over the LED in such manner as to interfere as little as possible with the light radiating from or to the reflector. In one embodiment a separate lens is bonded to the LED package with an index matched material; however, other means may be employed, including manufacturing the lens or lens and reflector portion of the invention which is then designed and manufactured as an integral component of the LED package.

The invention may also include additional lens surfaces or components with multiple indexes to control the center energy from the LED in a desired manner. These additional lens surfaces or lenses may be suspended or bonded in front of the LED so as to not interfere substantially with the reflected beam energy from the reflector portion of the invention. The reflector may be molded with the lens as a single component with its surface coated for reflectivity.

Thus, in summary one embodiment of the invention is an apparatus comprising a light source, preferably an LED, a reflector, a light-conducting element mounted on the light source for directing light from the light source to an end of the light-conducting element, and a lens mounted on the end of the light-conducting element for directing light into a first beam.

In one embodiment a portion of light from the light source is unrefracted and undirected by a peripheral portion of the light-conducting element. Light from the peripheral portion which is unrefracted is reflected by the reflector into a second beam. In another embodiment the peripheral portion of the light-conducting element refracts the light to a different degree than by the lens, for example in the preferred embodiment to a lesser degree than the lens. The light from the light source is collected and distributed into the first and second beams and can be characterized equivalent in a number of different ways, namely collected with almost no lost ray sets, collected and distributed with no substantial lost energy, collected with almost all the energy from the light source, or distributed with substantially all the energy from the light source.

In the preferred embodiment the light-conducting element directs light only to its end.

The lens has a radius of curvature, $r_2$, and the peripheral portion of the light-conducting element has a radius of curvature, $r_1$. In the preferred embodiment $r_2 > r_1$ and in another embodiment, $r_1 > r_2$.

In still another embodiment the lens is integrally molded with the light-conducting element. Further in another embodiment the lens, light-conducting element and reflector are integrally molded together. Still further in another embodiment the lens, light-conducting element, reflector and light source are integrally fabricated with each other.

In yet another embodiment the lens has an optically modulated surface.

In another embodiment the apparatus further comprises at least one additional lens arranged and configured to provide an optical compound system with the lens.

The scope of the invention also includes a method of optically processing light or providing light from a light source, such as an LED, according to the methodologies as practiced in each of the apparatus described above.

While the apparatus and method has or will be described for the sake of grammatical fluidity with functional explanations, it is to be expressly understood that the claims, unless expressly formulated under 35 USC 112, are not to be construed as necessarily limited in any way by the construction of "means" or "steps" limitations, but are to be accorded the full scope of the meaning and equivalents of the definition provided by the claims under the judicial doctrine of equivalents, and in the case where the claims are expressly formulated under 35 USC 112 are to be accorded full statutory equivalents under 35 USC 112. The invention can be better visualized by turning now to the following drawings wherein like elements are referenced by like numerals.

The invention and its various embodiments can now be better understood by turning to the following detailed description of the preferred embodiments which are presented as illustrated examples of the invention defined in the claims. It is expressly understood that the invention as defined by the claims may be broader than the illustrated embodiments described below.

DETAILED DESCRIPTION OF THE PREFERRED EMBODIMENTS

An apparatus comprises a light source, preferably an LED, a reflector, a light-conducting element mounted on the light source for directing light from the light source to an end of the light-conducting element, and a lens mounted on the end of the light-conducting element for directing light into a central beam. Light from the light source is directed to the reflector into a peripheral beam. The central and peripheral beams comprise substantially all of the light generated by the light source. The lens is in effect mounted on a pedestal above the LED. The pedestal transmits all the light rays in the central solid angle to the lens without loss.

Figure 1:
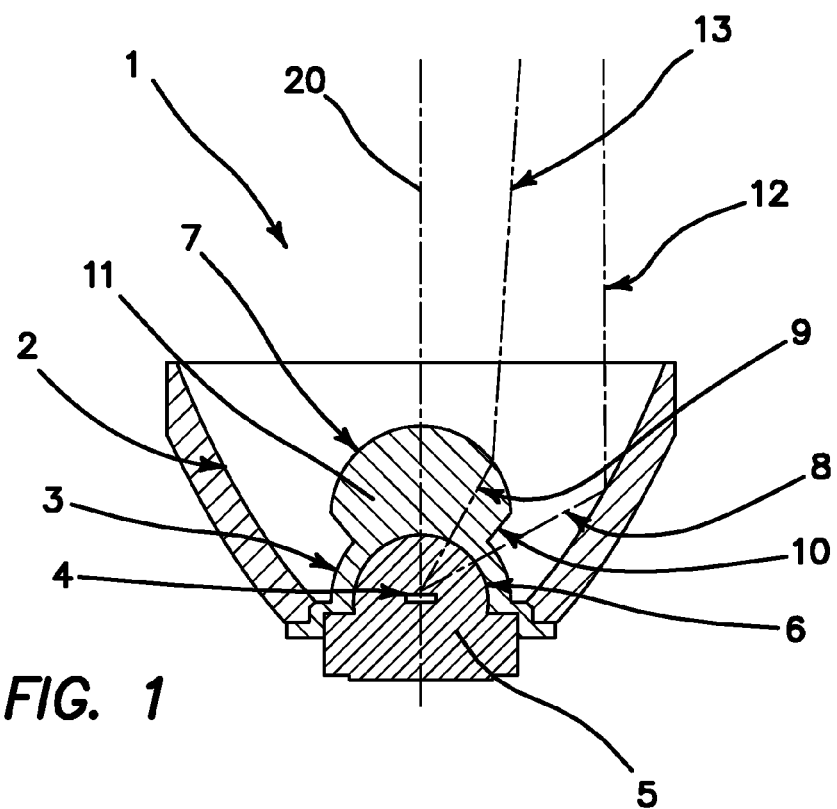
FIG. 1 is a side cross-sectional view of a first embodiment of the invention having a lens suspended over the LED emitter by a separate light-conducting element attached to the LED package.

Device 1 is illustrated in a first embodiment in a side cross-sectional view in FIG. 1. Lens 7 suspended over the LED emitter 4 by a light conducting element 11, which is attached to a conventional LED package 5. LED package 5 typically may incorporated a hemispherical ball lens as part of the package positioned over emitter 4 and is usually characterized by a Lambertian illumination pattern. Device 1 is generally rotationally symmetric about an optical axis 20 as better illustrated in the perspective view of FIG. 2. Element 11 may be a separately piece from lens 7 or as in the preferred embodiment may be integrally molded with lens 7. Element 11 acts in effect as a light pipe to direct light from LED package 5 to lens 7. Additionally, FIG. 1 shows the LED emitter 4 is situated substantially at the focus of a concave reflector 2 in such a manner as to collect essentially or substantially all the energy from the LED emitter 4 that is radiating into a region between about a 45 degree half angle from the centerline or optical axis of the LED emitter 4 and about a 95 degree half angle from the centerline or optical axis.

By the term "essentially", "substantially" or "almost" all the energy, we mean to allow small inherent energy losses by absorption or scattering of a ray being transmitted through peripheral portion 3 of element 11 and through such optical interfaces as may exist in the path of the ray as may occur in the optical materials used. In reality there are no optical materials or interfaces which are perfectly transmissive or reflective. Some amount of energy is always lost due to material and geometric imperfections. These inherent losses can be reduced by the use of conventional higher quality and usually more expensive optical quality materials and conventional higher quality manufacturing techniques. The inherent losses typically are always a matter of a trade off of cost against performance gains.

The energy or ray set in the peripheral solid angle directed to reflector 2, represented symbolically by ray 8, is reflected as represented by ray 12. The remainder of the rays of energy radiating from the LED emitter 4 that are contained within the half angles of about 45 degrees and zero degrees of the optical axis 20 in a central solid angle, and are symbolically represented by ray 9. The rays in the central solid angle are transmitted through element 11, collected by the lens 7 and then refracted and controlled by the optical properties of the lens surface(s) 7 as symbolically represented by ray 13.

In a preferred embodiment of the invention, lower azimuthal surface 3 is intended to be a spherical surface that provides no refractive power to the centered LED emitter 4, thus allowing the rays exiting this surface 3 to be unaltered as they progress toward the reflector surface 2. It is understood;

however, that surface 3 of the invention could be designed to have optical refractive power, if desired.

The peripheral surface 10 of element 11 is preferably arranged and configured to interfere as little as possible with the energy radiating from the LED emitter 4. For example, surface 10 may be everywhere substantially parallel to rays being transmitted in element 11 toward lens 7 so that substantially no refraction or reflection of any ray occurs at surface 10. Thus, element 11 acts simply as a light transmission guide from LED package 5 to lens 7 for the rays in the solid central angle.

Figure 2:
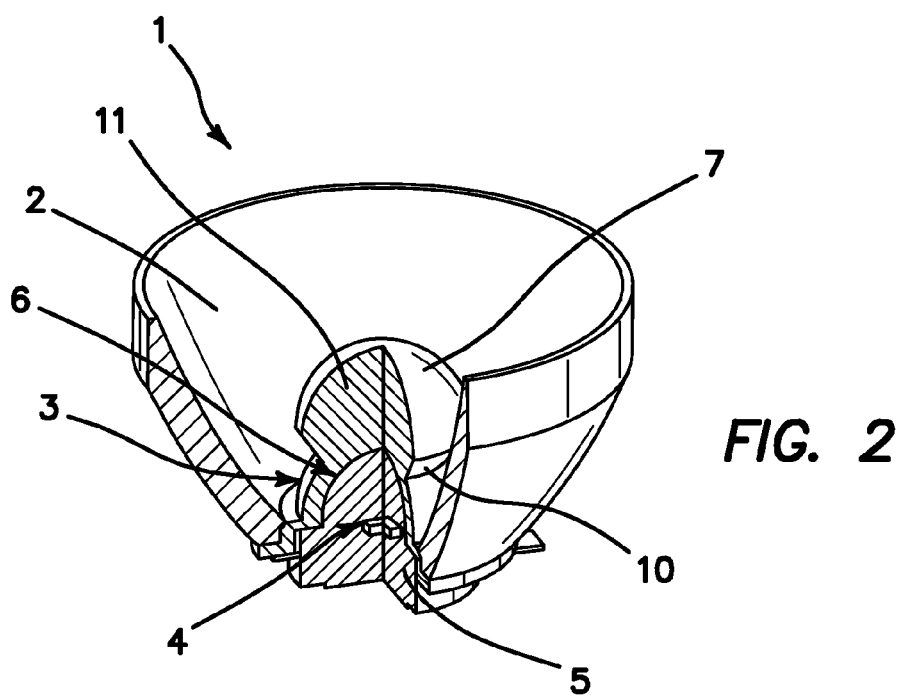
FIG. 2 is a perspective cutaway view of the device of FIG. 1 showing the relative components.

FIG. 2 is a cutaway perspective view of the device 1 showing the invention and its relative components. In a preferred embodiment of the invention, glue line 6 between element 11 and LED package 5 is composed of an index matching material that will alter the rays 8 and 9 of energy radiating from the LED emitter 4 as little as possible, if at all.

Figure 3:
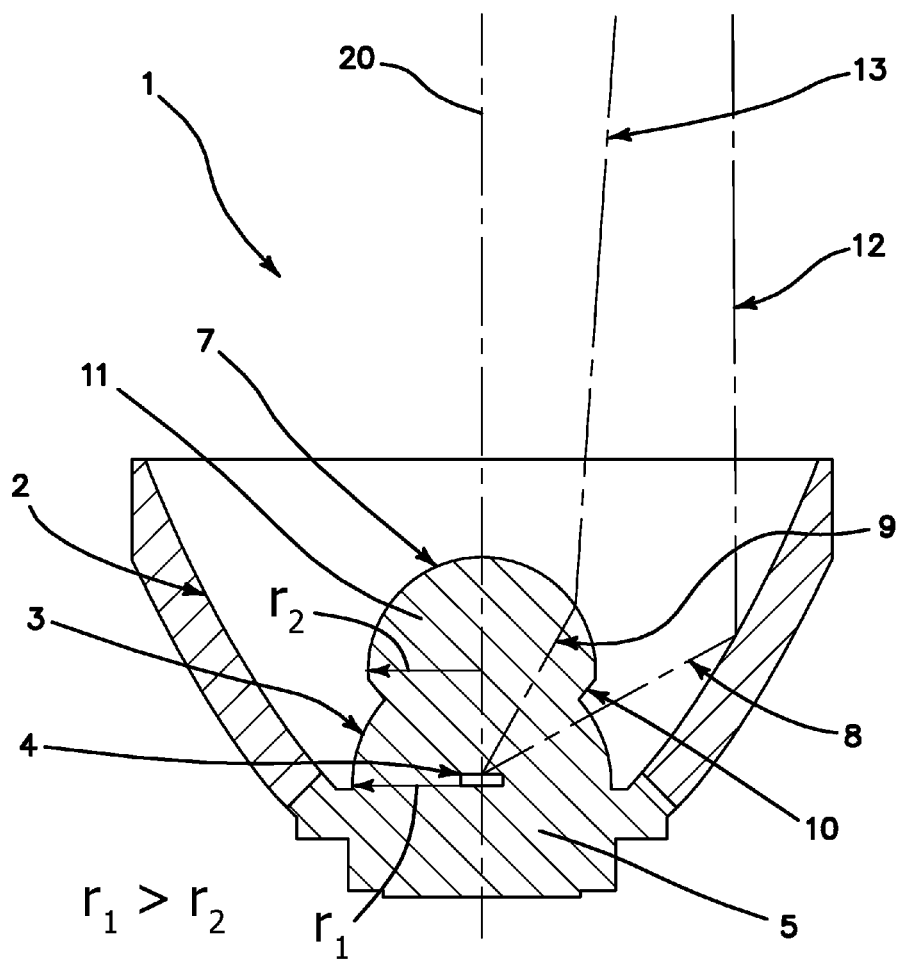
FIG. 3 is a side cross-sectional view of a second embodiment of the invention in which the lens and light conducting element are integrally molded.

FIG. 3 is a side cross-sectional view of an embodiment where lens 7, element 11, surface 3 and LED package 5 are all made integrally with each other so that there is no separate LED package apart from the structure of device 1. Reflector 2 may or may not be integral with the other elements of device 1. It is within the scope of the invention, however, that lens 7, element 11, surface 3 and reflector 2 may be integral with each other and LED package 5 with its emitter 4 is made separately and later joined thereto by an index matching adhesive. Alternatively, lens 7, element 11, surface 3, reflector 2 and LED package 5 may be integral with each other while emitter 4 is later mounted to the appropriate location in the base of the integral package. It is within the scope of the invention that any one or more elements of device 1 may be made separately from the remaining elements of device 1, which are integrally manufactured or formed together, and then joined to form the completed device as illustrated.

Figure 4:
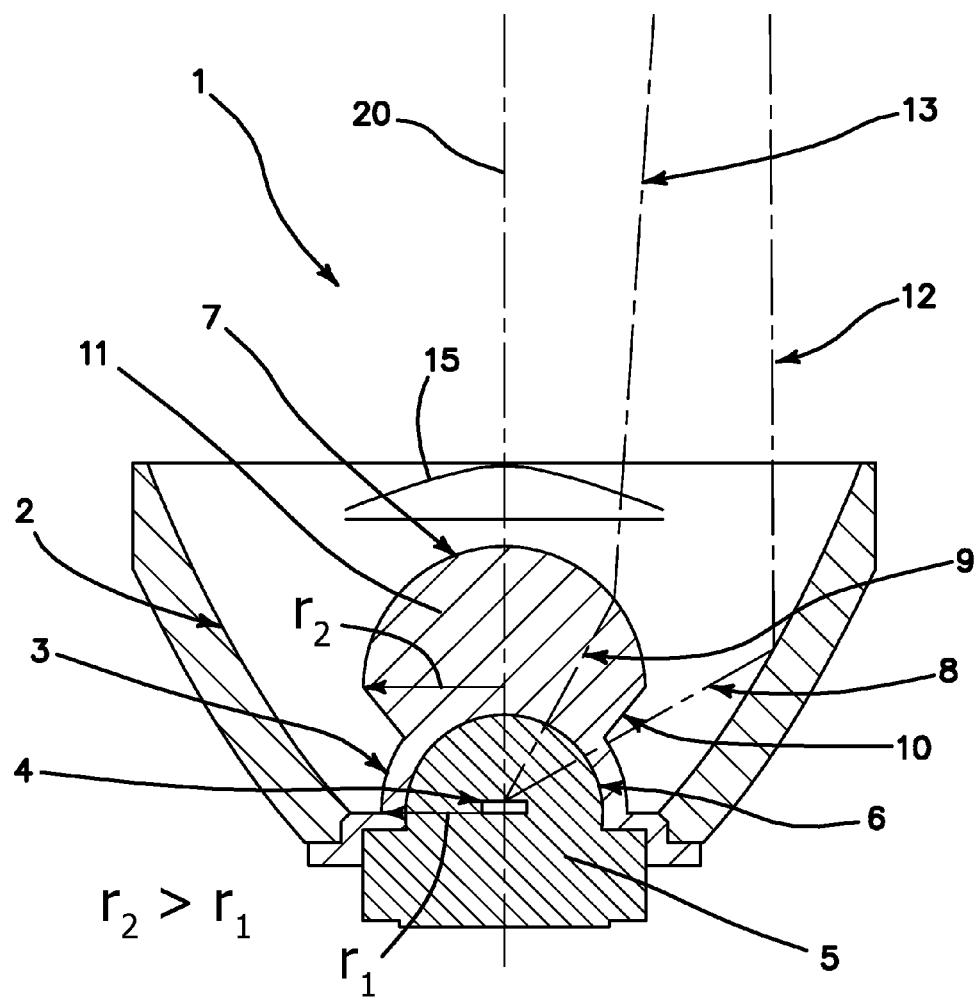
FIG. 4 a side cross-sectional view of a third embodiment of the invention in which an additional lens is suspended over the lens FIG. 5 a side cross-sectional view of a fourth embodiment of the invention in which a modulated surface or index of refraction is provided on the lens surface.

FIG. 4 is a side cross-sectional view of a third embodiment where a second lens 15 has been suspended by conventional means (not shown) such as a spider at a predetermined distance in front of lens 7 to provide a compound optical system as may be desired according to conventional optical design principles. Lens 15 thus symbolically represents one or more additional lenses or optical elements of any kind or description, which are now known or may be later devised.

Figure 5:
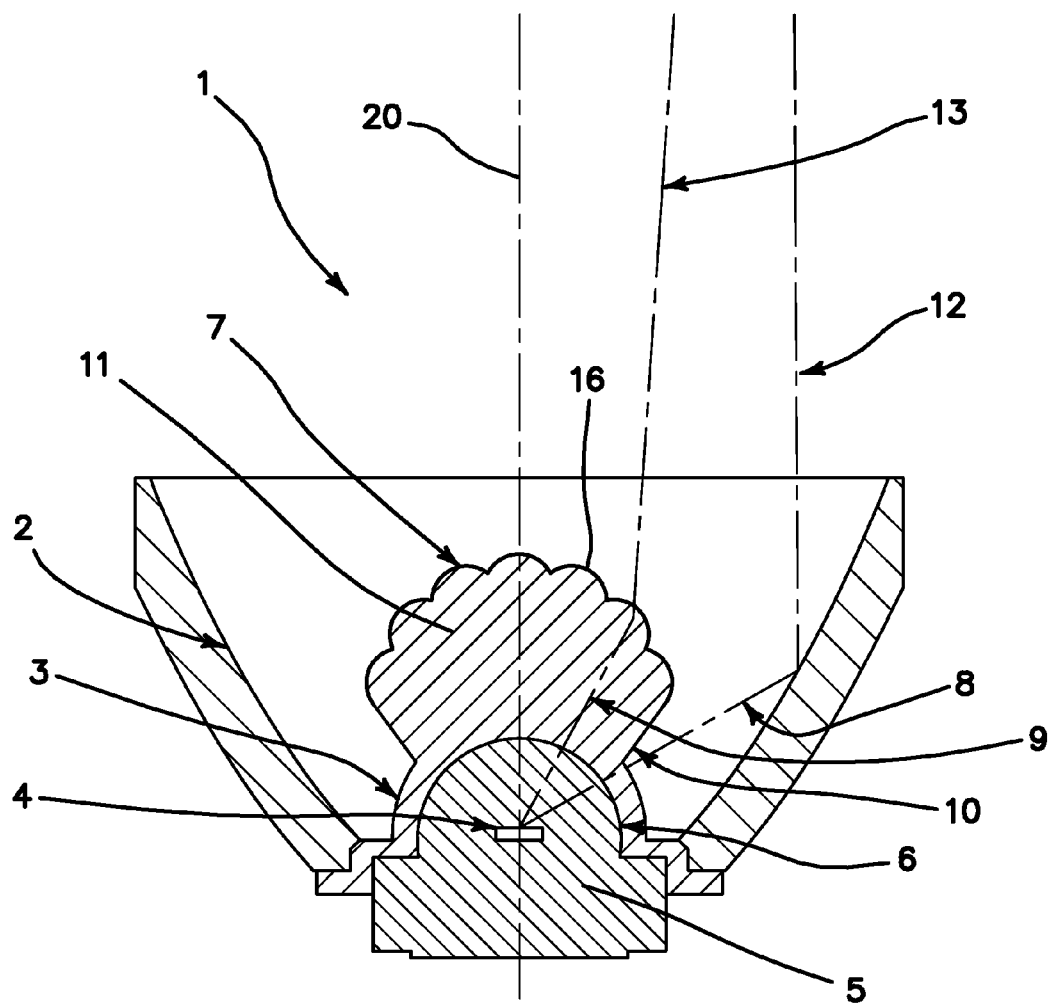

FIG. 5 is a side cross-sectional view of a fourth embodiment where a modulated surface 16 has been added to the surface of lens 7. This may be a dimpled, faceted, arbitrarily contoured surface layer which is adhered onto the surface of lens 7 or formed integrally therein with lens 7. Any type of surface treatment or configuration now known or later devised could be employed as surface 16. Additionally, the material of modulated surface 16 may have the same or different index of refraction as the material of lens 7. Modulated surface 16 may be composed of a plurality of materials with different, distributed or graduated indices of refraction at each point. For example, a Fresnel spherical prismatic lens array may be attached to or molded into the surface of lens 7 to provide additional optical processing of the rays of the central solid angle.

Many alterations and modifications may be made by those having ordinary skill in the art without departing from the spirit and scope of the invention. Therefore, it must be understood that the illustrated embodiment has been set forth only for the purposes of example and that it should not be taken as limiting the invention as defined by the following invention and its various embodiments.

For example, the apparatus could be used in general lighting, decorative and architectural lighting, emergency lighting, fiber optic illumination, flashlights, head torches, medical applications, vehicular, marine and aircraft applications, signage and many other applications.

Therefore, it must be understood that the illustrated embodiment has been set forth only for the purposes of example and that it should not be taken as limiting the invention as defined by the following claims. For example, notwithstanding the fact that the elements of a claim are set forth below in a certain combination, it must be expressly understood that the invention includes other combinations of fewer, more or different elements, which are disclosed in above even when not initially claimed in such combinations. A teaching that two elements are combined in a claimed combination is further to be understood as also allowing for a claimed combination in which the two elements are not combined with each other, but may be used alone or combined in other combinations. The excision of any disclosed element of the invention is explicitly contemplated as within the scope of the invention.

The words used in this specification to describe the invention and its various embodiments are to be understood not only in the sense of their commonly defined meanings, but to include by special definition in this specification structure, material or acts beyond the scope of the commonly defined meanings. Thus if an element can be understood in the context of this specification as including more than one meaning, then its use in a claim must be understood as being generic to all possible meanings supported by the specification and by the word itself.

The definitions of the words or elements of the following claims are, therefore, defined in this specification to include not only the combination of elements which are literally set forth, but all equivalent structure, material or acts for performing substantially the same function in substantially the same way to obtain substantially the same result. In this sense it is therefore contemplated that an equivalent substitution of two or more elements may be made for any one of the elements in the claims below or that a single element may be substituted for two or more elements in a claim. Although elements may be described above as acting in certain combinations and even initially claimed as such, it is to be expressly understood that one or more elements from a claimed combination can in some cases be excised from the combination and that the claimed combination may be directed to a subcombination or variation of a subcombination.

Insubstantial changes from the claimed subject matter as viewed by a person with ordinary skill in the art, now known or later devised, are expressly contemplated as being equivalently within the scope of the claims. Therefore, obvious substitutions now or later known to one with ordinary skill in the art are defined to be within the scope of the defined elements.

The claims are thus to be understood to include what is specifically illustrated and described above, what is conceptionally equivalent, what can be obviously substituted and also what essentially incorporates the essential idea of the invention.

We claim:

1. An apparatus comprising:
   a light source;
   an external reflector positioned relative to the light source for reflecting a first predetermined portion of the light from the light source into a first beam; and
   a light-conducting element disposed on or forming part of the light source having a first portion of its surface for allowing the first predetermined portion of the light to be transmitted without refraction to the reflector and having a second portion of its surface for directing light without refraction from a second predetermined portion of the light from the light source to a predetermined portion of the light-conducting element, where the predetermined portion forms a lens for directing the second predetermined portion of the light into a second beam, the lens being spaced from the light source by a predetermined distance, the first and second beams including substantially all of the light radiated from the light source.

2. The apparatus of claim 1 where the light-conducting element directs substantially all of the second predetermined portion of light only to the predetermined portion of the light-conducting element and hence to the lens.

3. The apparatus of claim 1 where substantially all of the light propagating through the lower peripheral portion of the light-conducing element is reflected by the reflector into the first beam.

4. The apparatus of claim 1 where substantially all of the light from the light source is collected and distributed into the first and second beams by the reflector, light-conducting element and lens with substantially no ray sets lost from the first and second beams.

5. The apparatus of claim 1 where substantially all of the light from the light source is collected and distributed into the first and second beams by the reflector, light-conducting element and lens with no substantial lost energy.

6. The apparatus of claim 1 where light from the light source is collected and directed into the first and second beams by the reflector, light-conducting element and lens with almost all the energy from the light source being in the first and second beams.

7. The apparatus of claim 1 where light from the light source is distributed into the first and second beams by the reflector, light-conducting element and lens with substantially all the energy from the light source.

8. The apparatus of claim 1 where the lens has a radius of curvature, $r_2$, where the lower peripheral portion of the light-conducting element has a radius of curvature, $r_1$, and where $r_2 > r_1$.

9. The apparatus of claim 1 where the lens has a radius of curvature, $r_2$, where the lower peripheral portion of the light-conducting element has a radius of curvature, $r_1$, and where $r_1 > r_2$.

10. A method comprising:
generating light from a light source;
directing a first predetermined portion of the light to a reflector without refraction of the light;
reflecting the first predetermined portion of the light into a first beam;
directing a second predetermined portion of the light to a predetermined portion of the light-conducting element without refraction; and
directing the second predetermined portion of the light into a second beam by means a lens spaced from the light source by a predetermined distance, the first and second beams including substantially all of the light generated by the light source.

11. The method of claim 10 where directing a second predetermined portion of the light to a predetermined portion of the light-conducting element comprises directing substantially all of the second predetermined portion of light only to the predetermined portion of the light-conducting element and hence to the lens.

12. The method of claim 10 where directing a first predetermined portion of the light to a reflector and reflecting the first predetermined portion of the light into a first beam comprises directing substantially all of the first predetermined portion of the light into the first beam.

13. The method of claim 10 where directing a first predetermined portion of the light, reflecting the first predetermined portion of the light into a first beam; directing a second predetermined portion of the light to a predetermined portion of the light-conducting element and directing the second predetermined portion of the light into a second beam comprises collecting and distributing substantially all of the light from the light source into the first and second beams with substantially no ray sets lost from the first and second beams.

14. The method of claim 10 where directing a first predetermined portion of the light, reflecting the first predetermined portion of the light into a first beam; directing a second predetermined portion of the light to a predetermined portion of the light-conducting element and directing the second predetermined portion of the light into a second beam comprises collecting and distributing substantially all of the light from the light source into the first and second beams with no substantial lost energy.

15. The method of claim 10 where directing a first predetermined portion of the light, reflecting the first predetermined portion of the light into a first beam; directing a second predetermined portion of the light to a predetermined portion of the light-conducting element and directing the second predetermined portion of the light into a second beam comprises collecting and distributing substantially all of the light from the light source into the first and second beams with almost all the energy from the light source being in the first and second beams.

16. The method of claim 10 where directing a first predetermined portion of the light, reflecting the first predetermined portion of the light into a first beam; directing a second predetermined portion of the light to a predetermined portion of the light-conducting element and directing the second predetermined portion of the light into a second beam comprises collecting and distributing substantially all of the light from the light source into the first and second beams with substantially all the energy from the light source.

\* \* \* \* \*